US006776496B2

(12) United States Patent
Cok

(10) Patent No.: US 6,776,496 B2
(45) Date of Patent: Aug. 17, 2004

(54) AREA ILLUMINATION LIGHTING APPARATUS HAVING OLED PLANAR LIGHT SOURCE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/223,265

(22) Filed: Aug. 19, 2002

(65) Prior Publication Data
US 2004/0032727 A1 Feb. 19, 2004

(51) Int. Cl.[7] .............................. F21V 9/16; F21S 8/08
(52) U.S. Cl. ...................... 362/84; 362/226; 362/414
(58) Field of Search ......................... 362/84, 226, 249, 362/800, 512, 410, 414, 217, 221, 222, 223, 555; 313/504, 512

(56) References Cited

U.S. PATENT DOCUMENTS 4,704,941 A * 11/1987 Reilly ....................... 84/464 A
6,168,282 B1    1/2001 Chien
6,171,117 B1 *  1/2001 Chien ........................ 439/86

FOREIGN PATENT DOCUMENTS

EP    1 094 436 A2   4/2001
EP    1 120 838 A2   8/2001
WO    WO 99/57945   11/1999

* cited by examiner

Primary Examiner—Alan Cariaso
Assistant Examiner—Guiyoung Lee
(74) Attorney, Agent, or Firm—Andrew J. Anderson; Thomas H. Close

(57) ABSTRACT

Lighting apparatus includes a solid-state area illumination light source, having: a planar substrate, an organic light emitting diode (OLED) layer deposited on the planar substrate, the organic light emitting diode layer including first and second electrodes for providing electrical power to the OLED layer, an encapsulating cover covering the OLED layer, and first and second conductors electrically connected to the first and second electrodes, and extending beyond the encapsulating cover for making electrical contact to the first and second electrodes by an external power source; and a lighting fixture for removably receiving and holding the solid state-light area illumination light source in a horizontal plane, the lighting fixture including contacts for providing electrical contact between said first and second conductors and an external power source.

34 Claims, 5 Drawing Sheets

US 6,776,496 B2

AREA ILLUMINATION LIGHTING APPARATUS HAVING OLED PLANAR LIGHT SOURCE

FIELD OF THE INVENTION

The present invention relates to the use of organic light emitting diodes for area illumination.

BACKGROUND OF THE INVENTION

The light emitting elements in conventional bulbs (the filament of an incandescent bulb or the fluorescent material in a fluorescent bulb) are extremely bright, emit light in every direction, and are painful to view directly. Moreover, the bulb itself is not adapted to control the direction of illumination. Therefore, traditional lighting devices such as incandescent or fluorescent light bulbs typically require reflectors or diffusers to control the light output. For example, desk, table, floor and ceiling lamps conventionally use shades to diffuse and reflect light to the ceiling or floor to provide indirect lighting suitable for use in a home or office environment. These reflectors and diffusers are expensive and take considerable space.

Spotlights, track lighting, or floodlights are adapted to direct light to a preferred area but are large and relatively expensive.

Solid-state lighting devices made of light emitting diodes are increasingly useful for applications requiring robustness and long-life. For example, solid-state LEDs are found today in automotive applications. These devices are typically formed by combining multiple, small LED devices providing a point light source into a single module together with glass lenses suitably designed to control the light as is desired for a particular application (see, for example WO99/57945, published Nov. 11, 1999). These multiple devices are expensive and complex to manufacture and integrate into single area illumination devices. Moreover, LED devices provide point sources of light, a plurality of which are employed for area illumination.

Organic light emitting diodes (OLEDs) are manufactured by depositing organic semiconductor materials between electrodes on a substrate. This process enables the creation of light sources having extended surface area on a single substrate. The prior art describes the use of electro-luminescent materials as adjuncts to conventional lighting (for example U.S. Pat. No. 6,168,282, issued Jan. 2, 2001 to Chien). In this case, because of the limited light output from the electro-luminescent material, it is not useful for primary lighting.

EP1120838A2, published Aug. 1, 2001 describes a method for mounting multiple organic light emitting devices on a mounting substrate to create a light source. However, this approach of mounting multiple light sources on a substrate increases the complexity and hence the manufacturing costs of the area illumination light source.

There is a need therefore for an improved OLED lighting apparatus for area illumination having a simple construction that provides a robust light but does not require additional reflectors or diffusers.

SUMMARY OF THE INVENTION

The need is met by providing a lighting apparatus that includes a solid-state area illumination light source having: a planar substrate, an organic light emitting diode (OLED) layer deposited on the planar substrate, the organic light emitting diode layer including first and second electrodes for providing electrical power to the OLED layer, an encapsulating cover covering the OLED layer, and first and second conductors electrically connected to the first and second electrodes, and extending beyond the encapsulating cover for making electrical contact to the first and second electrodes by an external power source; and a lighting fixture for removably receiving and holding the solid-state light area illumination light source in a horizontal plane, the lighting fixture including contacts for providing electrical contact between said first and second conductors and an external power source.

ADVANTAGES

The present invention has the advantage of providing an inexpensive, long lived, highly efficient, light source that provides diffuse and indirect illumination without the need for additional components.

It will be understood that the figures are not to scale since the individual layers are too thin and the thickness differences of various layers too great to permit depiction to scale.

DETAILED DESCRIPTION OF THE INVENTION

Figure 1:
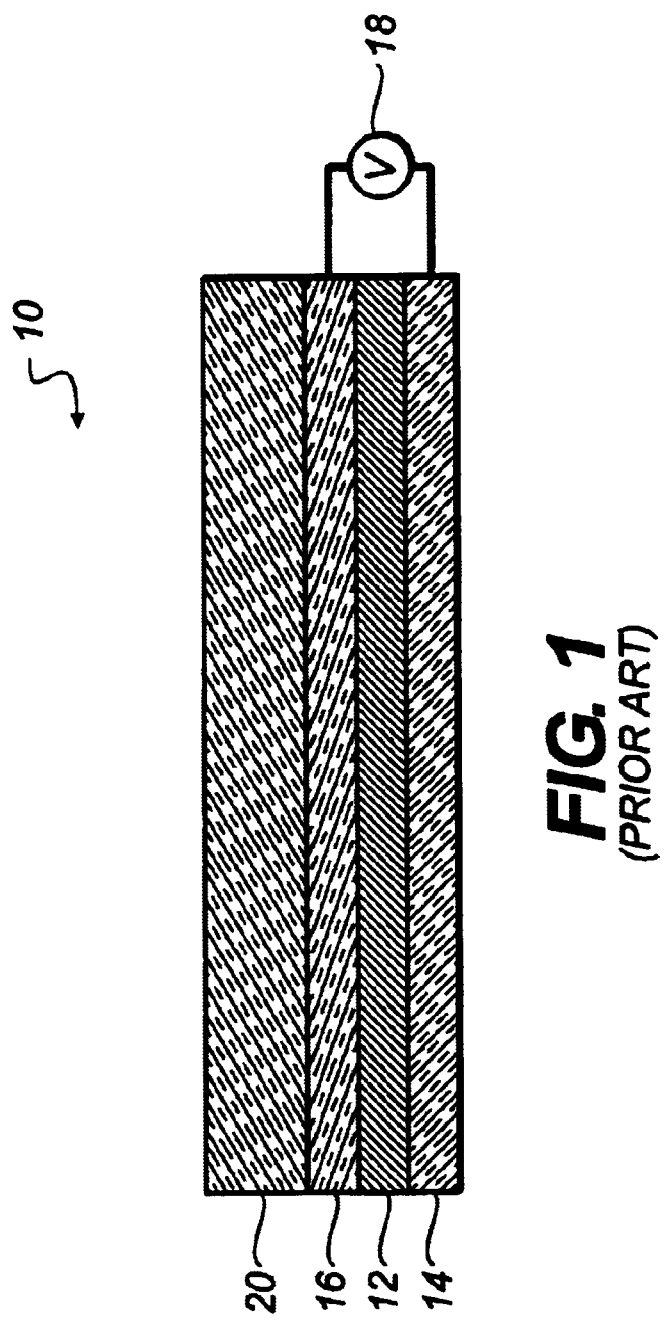
FIG. 1 illustrates a partial cross section of a prior art conventional OLED illumination device.

FIG. 1 is a schematic diagram of a prior art OLED light source including an organic light emitting layer 12 disposed between two electrodes, e.g. a cathode 14 and an anode 16. The organic light emitting layer 12 emits light upon application of a voltage from a power source 18 across the electrodes. The OLED light source 10 typically includes a substrate 20 such as glass or plastic. It will be understood that the relative locations of the anode 16 and cathode 14 may be reversed with respect to the substrate. The term OLED light source refers to the combination of the organic light emitting layer 12, the cathode 14, the anode 16, and other layers described below.

Figure 2:
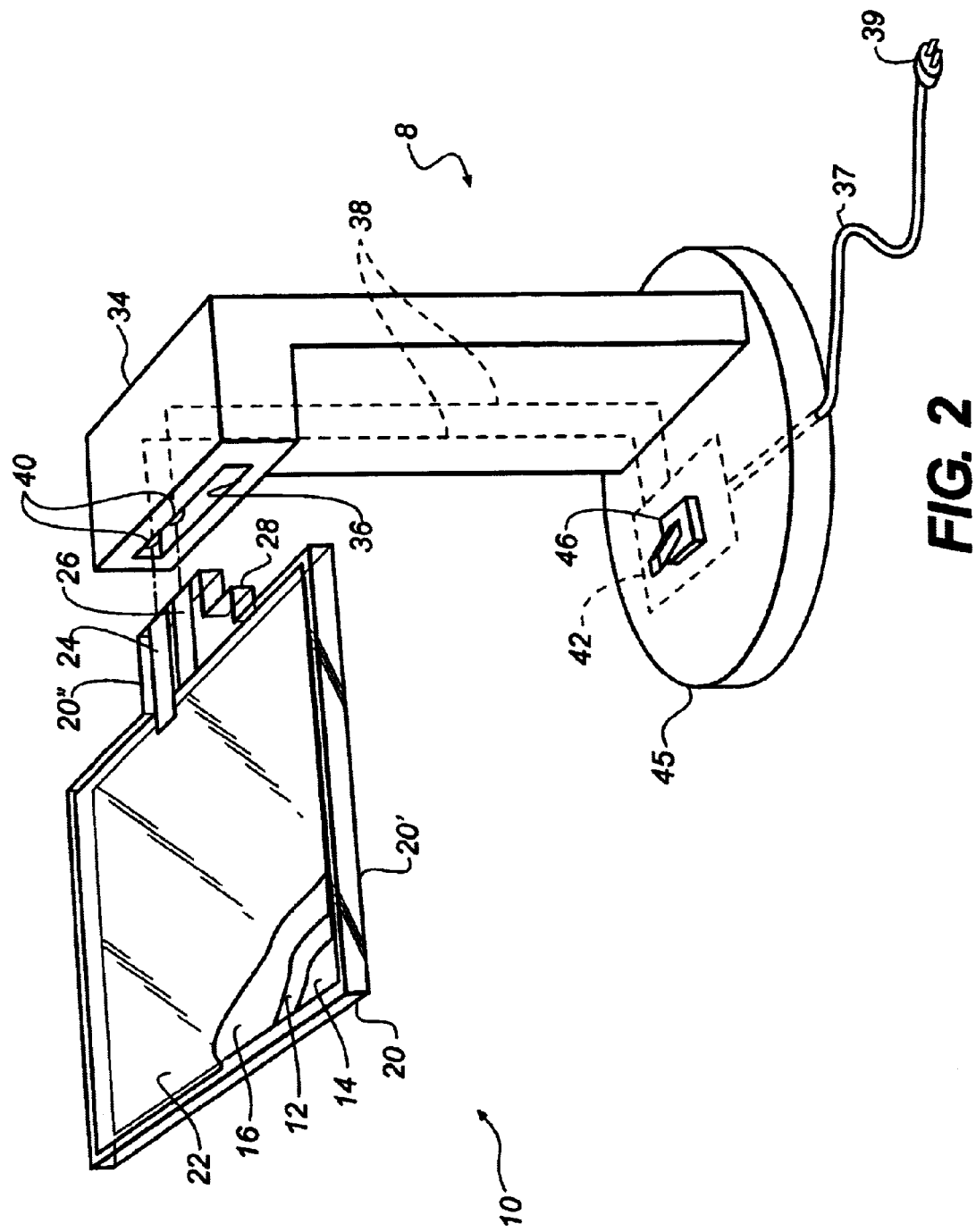
FIG. 2 is a partially broken away perspective view of lighting apparatus according to one embodiment of the present invention.

Referring to FIG. 2, a perspective view of lighting apparatus (e.g. a table lamp) according to one embodiment of the present invention is shown. The lighting apparatus includes an OLED light source 10 of the type shown in FIG. 1 and a socket 34 for removably receiving and holding the light source 10. The lighting apparatus and socket are designed to hold the planar OLED light source in a horizontal position so that the light is generally directed toward the ceiling, and/or the floor which is achieved in conventional lighting apparatus by the use of lamp shades or reflectors. The lighting apparatus of the present invention eliminates the necessity of such shades or reflectors.

The horizontal arrangement of the light source provides pleasing, indirect area illumination. As viewed in a typical environment, the light source is not as bright as a typical incandescent lamp, for example, because it emits light over an area rather than a very short one-dimensional filament, thereby reducing the impact on the eye of an observer. Moreover, the horizontal arrangement of the light source directs most of the light upwards to the ceiling or downwards to the floor, as typical prior art lamps do, without resorting to shades or other bulky reflectors and diffusers.

According to one embodiment of the present invention, the light source 10, includes a substrate 20, the substrate defining a body portion 20' and a tab portion 20". An organic light emitting layer 12 is disposed between a cathode 14 and an anode 16. An encapsulating cover 22 is provided over the light source 10 on the body portion 20' of the substrate 20. To minimize cost of manufacture, assembly, and design and to maximize the robustness of the light source 10 according to the present invention, the materials are deposited onto a single unitary substrate 20 (rather than applying separate tiled display elements to a second substrate as taught in the prior art).

The cover 22 may be a separate element such as a hermetically sealed cover plate affixed over the layers 12, 14, and 16 or the cover may be coated over the layers 12, 14, and 16 as an additional layer. The OLED light emitting layer 12 is continuous over the substrate to provide a continuous light emitting area. First and second conductors 24 and 26 located on the substrate 20 are electrically connected to the first and second electrodes 14 and 16, and extend on tab portion 20" beyond the encapsulating cover 22 for making electrical contact to the first and second electrodes by an external power source (not shown).

In a preferred embodiment of the present invention, the tab portion 20" defines an orientation feature such as step 28 to insure that the illumination source is inserted in the socket 34 in the correct orientation. To allow light to be emitted from the OLED light source 10, the substrate 20, the electrodes 14 and 16, and the cover 22 are transparent. In applications where it is not required to emit light from both sides of the substrate, one or more of the substrate, cover, anode, or cathode may be opaque or reflective. The cover and/or substrate may also be light diffusers.

A lighting fixture 8 includes a socket 34 that defines an aperture 36 for receiving the tab portion 20" and includes first electrical contacts 40 located in the aperture 36 for making electrical connection to the first and second conductors 24 and 26 of the light source. The lighting fixture includes electrical conductors 38 which are electrically connected to first electrical contacts 40 and a power cord 37 which includes a plug 39 for making electrical connection to an external power source (not shown).

Duplicate first electrical contacts (not shown) may be provided in the aperture 36 so that the tab portion 20" (assuming it does not include an orientation feature 28) may be inserted in either orientation into the aperture 36 and will still connect appropriately to the external power source. The light source 10 is physically inserted into or removed from the socket 34 by pushing or pulling the tab portion of the substrate into or out of the socket 34. The light source and the socket 34 are preferably provided with a detent (not shown) to hold the light source in the socket.

The orientation feature 28 may be used to prevent the OLED light source from being inserted upside-down. Alternatively, the orientation feature 28 may be excluded and the socket adapted to receive the light source in either orientation to enable selection of the direction in which light is emitted (for example if the light source includes a reflective layer and emits light from only one surface).

Figure 3:
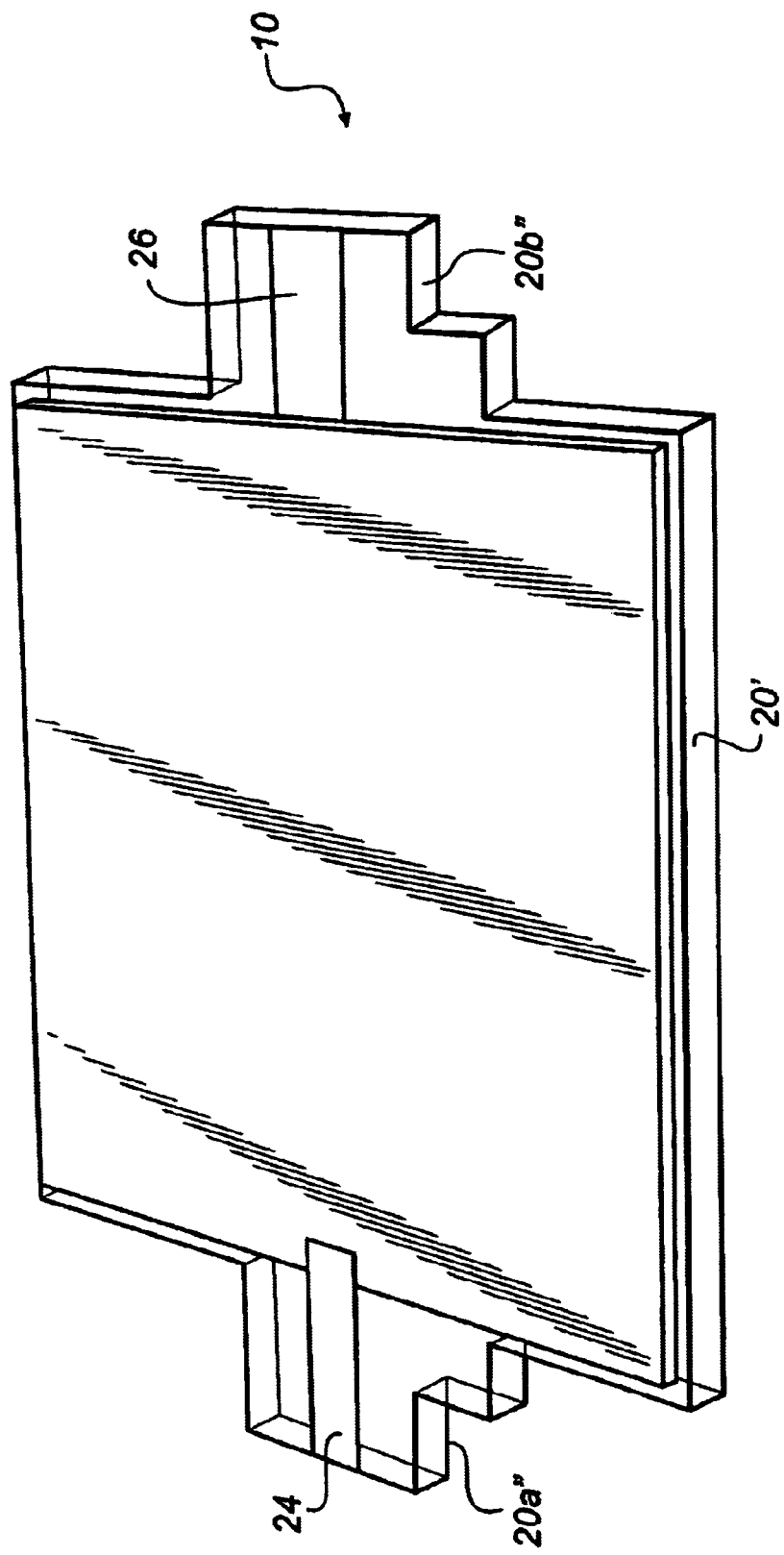
FIG. 3 is a perspective view of an alternative embodiment of a light source useful in the present invention.

FIG. 3 illustrates an alternative embodiment of the present invention wherein the substrate 20 has a body portion 20' with two tabs 20"a and 20"b located at opposite ends of the body portion 20'. As shown in FIG. 3, one of the conductors 24 and 26 is located on each tab. The body portion may be elongated in the direction between the tabs to provide a strip illuminator in the style of a fluorescent tube light source.

Figure 5:
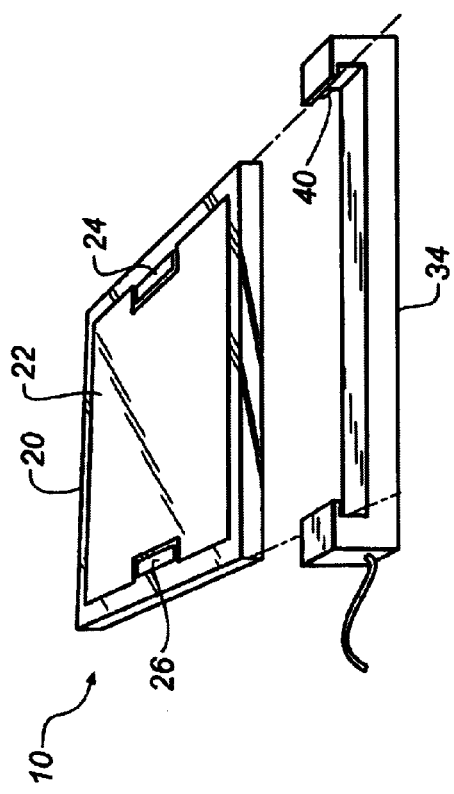
FIG. 5 is a perspective view of lighting apparatus according to a further alternative embodiment of the present invention.
Figure 4:
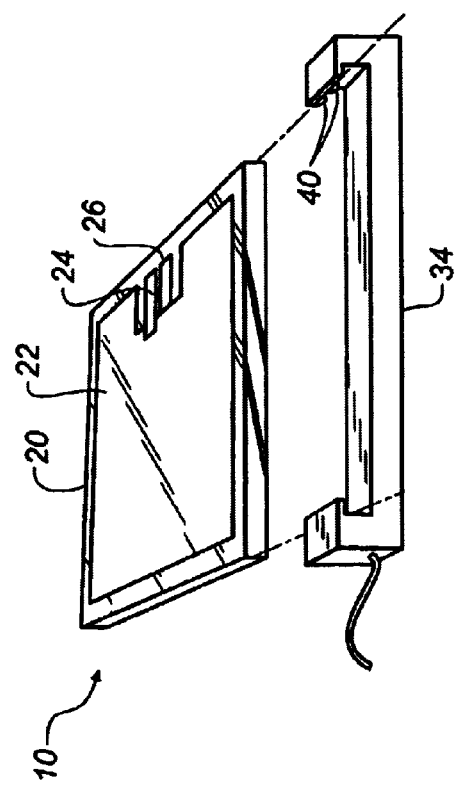
FIG. 4 is a perspective view of lighting apparatus according to an alternative embodiment of the present invention.
Figure 6:
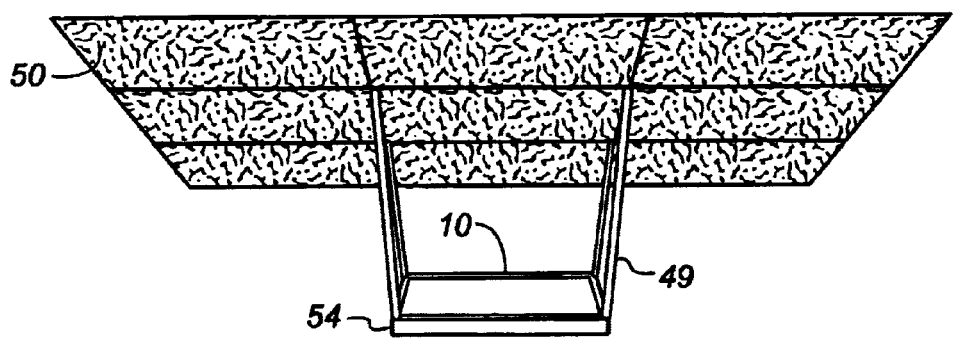
FIG. 6 is a perspective view of a suspended lighting apparatus according to the present invention.

Referring to FIG. 4, in a further alternative embodiment of the lighting apparatus, the substrate 20 does not include a tab portion, and the first and second conductors are located on the edge of the substrate 20. The light source 10 includes a substrate 20 with first and second conductors 24 and 26 located on the edge of the substrate 20 and is held by its edges in a C-shaped socket 34 such that the electrical contacts 40 make an electrical connection to the first and second conductors 24 and 26. FIG. 5 illustrates an alternative arrangement wherein the first and second conductors 24 and 26 are located at opposite edges of the substrate 20 and C-shaped socket 34 is provided with contacts 40 located in opposite arms of the socket 34. The light source 10 may emit light from only one side (e.g. the side facing away from the socket) and the first and second conductors located on the opposite side. FIG. 6 illustrates an arrangement in which the light source 10 is suspended from a ceiling 50 by a lighting fixture that includes a frame 54 and arms 49 to provide direct illumination downwards and reflected illumination from the ceiling. Arms 49 may be rigid elements such as bars or tubes, or flexible elements such as chains or cords. A power cord may be included in one of the arms 49.

Figure 7:
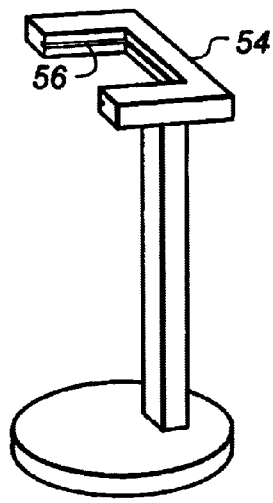
FIG. 7 is a perspective view of a lighting fixture for supporting a flexible light source according to one embodiment of the invention.

The substrate 20 can be either rigid or flexible. Rigid substrates, such as glass, provide more structural strength and are generally planar and may have a variety of shapes other than rectangular. The present invention may also be used with a flexible substrate, such as plastic. If a flexible substrate is used, the flexible transparent substrate may be attached to a rigid support or held within a frame. The frame may be opaque or transparent depending on the lighting and decorating needs of the application. Referring to FIG. 7, a floor lamp according to the present invention includes a frame 54 adapted to receive and support a flexible light source (not shown) in a slot 56.

Referring back to FIG. 2, the lighting apparatus may include a power converter 42 to convert the electrical power from the external power source to a form suitable for powering the OLED light source 10. In a preferred embodiment, the external power source is a standard power source, for example, the power supplied to a house or office at 110 V in the United States or 220 V in the United Kingdom. Other standards such as 24 V DC, 12 V DC and 6 V DC found in vehicles, for example, may also be used.

The OLED light source 10 may require a rectified voltage with a particular waveform and magnitude; the converter 42 can provide the particular waveform using conventional power control circuitry. The particular waveform may periodically reverse bias the light emitting organic materials to prolong the life-time of the OLED materials in the light source 10. The converter 42 may be located in the socket 34 or a supporting base 45 (for example, floor lamps, desk lamps, and table lamps) as shown in FIG. 2. The lighting fixture 8 may also include a switch 46 for controlling the power to the light source 10.

The brightness of the lighting apparatus may be controlled by varying the power provided to the OLED light source 10. In particular, pulse-width modulation schemes well known in the art may be employed (see for example, EP1094436A2, published Apr. 25, 2001) and implemented by the converter 42. Alternatively, the amount of power provided to the light emitting area may be reduced, for example by reducing the voltage or limiting the current supplied to the OLED light source 10. Brightness control may be provided by a control element such as a rotary, variable resistance switch integrated into the socket or base in place of the switch 46.

The OLED light source 10 can be provided as a standard element and sockets 34 customized to markets with differing power systems. OLED light sources 10 may be provided with different shapes or other attributes useful in specific applications and may be employed with a common socket, thereby decreasing costs and improving usefulness of the lighting apparatus.

In a preferred embodiment, the substrate and OLED materials of the OLED light source 10 are manufactured separately from the sockets 34 so that the sockets may be customized to markets with differing power systems. The substrates, in contrast, may be standardized and may be used with any socket to provide advantages of manufacturing and marketing scale. Moreover, substrates with different shapes or other attributes useful in a specific application may be employed with a common socket, thereby decreasing costs and improving usefulness. For example, the substrate may be shaped to provide a practical or decorative planar shape such as a trapezoid, a rectangle (as shown in FIG. 6), a disc, a pear shape, a ring, and a graphic element.

Figure 8:
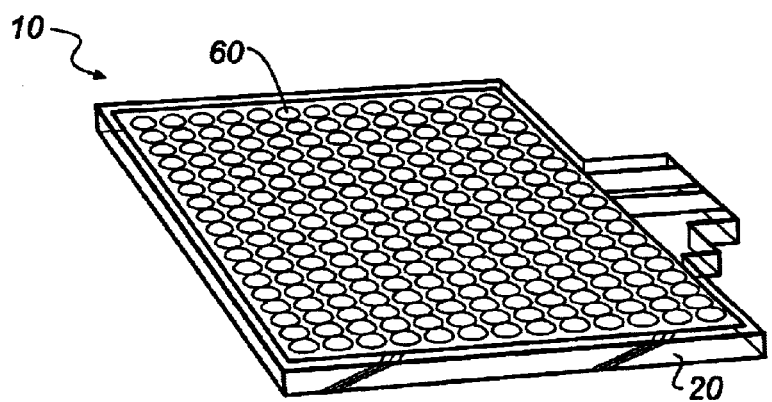
FIG. 8 is perspective view of an OLED light source including a fresnel lens.

The substrate 20 and/or cover 22 may be suitably treated to provide directional lighting. For example, the cover, substrate, or one of the electrodes may be provided with a reflective surface so that light emitted by the OLED layer will travel through the other surface and the device will emit light from only one side. Likewise, light that propagates along the substrate or cover may be out-coupled by providing a bevel on the edges of the substrate and/or cover or by frosting the edges of the substrate and/or cover. Alternatively, the edges may be treated, for example with a non-reflective coating to improve the light output. Likewise, the external surface of the substrate or cover may be treated or modified to improve light output characteristics, for example by frosting to provide light diffusion. Referring to FIG. 8, the direction of the light emitted from the planar light source may be modified by placing an optical element such as a lenslet array 60 on the planar substrate or encapsulating cover of the OLED light source. The lenslet array may be formed in the substrate or encapsulating cover for example by molding or embossing.

The present invention has the added advantage that the light source has a compact planar configuration enabling efficient storage, packing, and shipping.

The present invention may be employed in a wide variety of conventional applications, for example in a table-top lamp, floor-lamp, or chandelier. Alternatively, the invention may be employed as a flat-panel illumination device for a conventional suspended ceiling. The present invention may also be employed in portable illumination devices using DC power sources.

In a preferred embodiment, the invention is employed in an area illumination device that includes an Organic Light Emitting Diode (OLED) which is composed of small molecule or polymeric OLED materials as disclosed in but not limited to U.S. Pat. No. 4,769,292, issued Sep. 6, 1988 to Tang et al., and U.S. Pat. No. 5,061,569, issued Oct. 29, 1991 to VanSlyke et al. The light source may also include multiple light emitting layers as described in commonly assigned U.S. patent application Ser. No. 10/213,853 filed Aug. 7, 2002 by Yuan-Sheng Tyan, and U.S. patent application Ser. No. 10/077,270 filed Feb. 15, 2002 by Liao et al., the disclosures of which are incorporated herein by reference.

The invention has been described in detail with particular reference to certain preferred embodiments thereof, but it will be understood that variations and modifications can be effected within the spirit and scope of the invention.

PARTS LIST 8 lighting fixture
10 OLED light source
12 organic light emitting layer
14 cathode
16 anode
18 power source
20 substrate
20' body portion of substrate
20" tab portion of substrate
22 encapsulating cover
24 first conductor
26 second conductor
28 step
34 socket
36 aperture
37 power cord
38 electrical conductors
39 plug
40 contacts
42 converter
45 base
46 switch
49 arms
50 ceiling
54 frame
56 slot
60 lenslet array

What is claimed is:

1. Lighting apparatus, comprising:
   a) a solid-state area illumination light source, having:
      i) a planar substrate,
      ii) an organic light emitting diode (OLED) layer deposited on the planar substrate, the organic light emitting diode layer including first and second electrodes for providing electrical power to the OLED layer,
      iii) an encapsulating cover covering the OLED layer, and
      iv) first and second conductors electrically connected to the first and second electrodes, and extending beyond the encapsulating cover for making electrical contact to the first and second electrodes by an external power source; and
   b) a lighting fixture for removably receiving and holding the solid state-light area illumination light source in a horizontal plane, the lighting fixture including contacts for providing electrical contact between said first and second conductors and an external power source.

2. The light source claimed in claim 1, wherein the substrate is a rigid planar substrate.

3. The light source claimed in claim 2, wherein the cover is a hermetically sealed cover plate.

4. The light source claimed in claim 1, wherein the substrate is flexible.

5. The light source claimed in claim 4, further comprising a support for holding the substrate in a plane.

6. The light source claimed in claim 5, wherein the support is a frame.

7. The lighting apparatus claimed in claim 1, wherein the light source defines a body portion and one or more tab portions; the first and second conductors being located on the tab portion(s).

8. The lighting apparatus claimed in claim 7, wherein the tab portion(s) include an orientation feature for orienting the light source in a socket.

9. The lighting apparatus claimed in claim 7, wherein the light source defines tabs that are located at opposite edges of the substrate.

10. The lighting apparatus claimed in claim 1, wherein the first and second conductors are located at one or more edges of the light source.

11. The lighting apparatus claimed in claim 10, wherein the first and second conductors are located at opposite edges of the light source.

12. The lighting apparatus claimed in claim 1, wherein the light source emits light from one side of the support and the first and second conductors are located on an opposite side.

13. The lighting apparatus claimed in claim 1, wherein the encapsulating cover is a coated layer.

14. The lighting apparatus claimed in claim 1, wherein the OLED layer is continuous over the substrate.

15. The lighting apparatus claimed in claim 1, wherein the light source operates on standard power.

16. The lighting apparatus claimed in claim 15, wherein the standard power is selected from the group consisting of 110 volt AC, 220 volt AC, 24 volt DC, 12 volt DC, and 6 volt DC.

17. The lighting apparatus claimed in claim 1, wherein the planar substrate is transparent.

18. The lighting apparatus claimed in claim 1, further comprising a base adapted to be received by and make electrical contact with a standard electrical outlet.

19. The lighting apparatus claimed in claim 1, further comprising: a converter connected to the first and second conductors for converting power from the external power source to a form useable by the OLED layer.

20. The lighting apparatus claimed in claim 19, wherein the converter converts AC line voltage to a form useable by the OLED layer.

21. The lighting apparatus claimed in claim 1, wherein the lighting apparatus is a ceiling lamp.

22. The lighting apparatus claimed in claim 21, wherein the lamp is a suspended lamp.

23. The lighting apparatus claimed in claim 1, wherein the lighting apparatus is a table lamp.

24. The lighting apparatus claimed in claim 1, wherein the lighting apparatus is a floor lamp.

25. The lighting apparatus claimed in claim 1, wherein the planar substrate is transparent, and light is emitted from the OLED layer through the planar substrate.

26. The lighting apparatus claimed in claim 1, wherein the encapsulating cover is transparent, and light is emitted from the OLED layer through the encapsulating cover.

27. The lighting apparatus claimed in claim 1, wherein the light source emits light from only one side of the substrate and further includes a reflective layer on the other side of the substrate.

28. The lighting apparatus claimed in claim 1, wherein the light source emits light from both sides of the substrate.

29. The lighting apparatus claimed in claim 1, further comprising an optical element for directing the light from the light source.

30. The lighting apparatus claimed in claim 29, wherein the optical element is a lenslet array.

31. The lighting apparatus claimed in claim 29, wherein the optical element is a part of the lighting fixture.

32. The lighting apparatus claimed in claim 29, wherein the optical element is a part of the light source.

33. The lighting apparatus claimed in claim 32, wherein the substrate or the encapsulating cover includes the optical element.

34. The lighting apparatus claimed in claim 33, wherein the optical element is a fresnel lens formed in the substrate or the encapsulating cover.

* * * * *